United States Patent [19]

Dugan

[11] 4,371,974
[45] Feb. 1, 1983

[54] NRZ DATA PHASE DETECTOR

[75] Inventor: John M. Dugan, Garland, Tex.

[73] Assignee: Rockwell International Corporation, El Segundo, Calif.

[21] Appl. No.: 238,179

[22] Filed: Feb. 25, 1981

[51] Int. Cl.³ .............................................. H03L 7/06
[52] U.S. Cl. ...................................... 375/82; 307/516; 328/133; 329/50; 375/120
[58] Field of Search ............... 307/511, 514, 516, 518, 307/520, 521, 526; 328/109, 133, 134; 329/50, 122, 124; 331/1 A, 11, 12; 340/825.7; 360/41, 42, 51; 375/80, 81, 82, 83, 119, 120

[56] References Cited

U.S. PATENT DOCUMENTS

| | | | |
|---|---|---|---|
| 2,521,789 | 9/1950 | Grosdoff | 328/134 |
| 3,986,125 | 10/1976 | Eibner | 328/133 |
| 3,989,931 | 11/1976 | Phillips | 328/134 |
| 4,017,803 | 4/1977 | Baker | 375/81 |
| 4,184,122 | 1/1980 | Clark et al. | 328/133 |
| 4,191,976 | 3/1980 | Braun | 360/51 |

Primary Examiner—Benedict V. Safourek
Attorney, Agent, or Firm—Michael E. Taken; V. Lawrence Sewell; Howard R. Greenberg

[57] ABSTRACT

A digital phase detector is provided for NRZ data phase detection. In a phase locked loop application, the detector generates a variable duration pulse between a data transition and a positive transition of the recovered clock, and generates a fixed duration pulse between the positive clock transition and the next negative clock transition. The difference in duration between the variable and fixed pulses provides phase indication.

1 Claim, 4 Drawing Figures

NRZ DATA PHASE DETECTOR

TECHNICAL FIELD

The invention relates to digital phase detectors for NRZ (non-return-to-zero) data, for example suitable for clock recovery apparatus, for such as a phase locked loop, deriving clock pulses from an NRZ data stream.

BACKGROUND

In an NRZ data stream, a data pulse stays at one level or another for the entire duration of a bit interval, i.e., for one full clock cycle. For example, a sequence of three consecutive 1's is presented by a constant level signal lasting three bit intervals, or three clock cycles. This is in contrast to an RZ (return-to-zero) data stream wherein a digital 1 is represented by a pulse which does not last the entire bit interval but rather returns to zero. For example, a sequence of three consecutive 1's in an RZ data stream is presented by three consecutive distinct pulses, each lasting one-half bit interval or clock cycle and returning to zero for the remainder of its clock cycle.

In both NRZ and RZ data streams, it is necessary to have a train of clock pulses providing timing information for demarcation of bit intervals in the identification of 1's and 0's in the data stream. In a communication system, it may be necessary to derive or "recover" clock pulses from the occurrence of the received data pulses.

One kind of circuit used to recover clock pulses from a data stream is a phase locked loop. In this type of circuit, a voltage controlled oscillator (VCO) generates clock pulses which are fed together with received data pulses to a phase detector. The phase detector generates a voltage which is some function of the difference in phase between the data and the clock. The voltage from the phase detector drives the voltage controlled oscillator to produce clock pulses which stay in phase with the data pulses.

My Application Ser. No. 06/084,336, "Apparatus for Deriving Clock Pulses from Return-to-Zero Data Pulses", filed Oct. 12, 1979, discloses clock recovery apparatus for RZ data, including a phase detector. In this phase detector, a measuring interval is initiated by a data transition and is terminated by the opposite data transition one-half clock cycle later. The relative time of occurrence of a clock transition within this measuring interval gives an indication of the phase difference between the data and the clock. The duration from a rising data edge to a clock transition is compared against the duration from that clock transition to the falling data edge, and the duration difference corresponds to phase differential. Since each data pulse returns to zero during its bit interval, the falling data edge transition may be used to terminate the measuring interval.

In an NRZ data stream, the falling data edge transition may not be used to terminate the measuring interval because it is not known when such transition will occur. For example, if the next bit is a zero, then the data will transit low at the end of the current bit interval; but if the next data bit is a 1, then the data will stay high and no data edge transition will occur at the end of the current bit interval. In an RZ data stream, a data 1 transits high and then low all within one bit interval (the data pulse has a duration of one-half clock cycle). If the next data bit is also a 1, then the data will again transit high and then low. The falling data edge in an RZ data stream may thus be used to terminate the measuring interval because it is known that such edge transition will occur within the bit interval and one-half clock cycle after the rising data edge. In an NRZ data stream, the time of occurrence of the falling data edge is indeterminate and hence not suitable for providing a known relative timing reference.

Various phase detection schemes have been attempted for NRZ data. An analog approach to NRZ data phase detection involves the use of a differentiator receiving NRZ data and generating positive and negative analog pulses in response to data edges. These analog pulses are typically half or full wave rectified and then fed together with recovered clock pulses to a multiplier mixer whose output is the phase error control to the VCO. This multiplier mixer is typically complex and expensive, particularly at high frequency data rates where transformers may become necessary.

A digital approach to NRZ data phase detection involves the use of a monostable one-shot multivibrator for receiving NRZ data and converting data edges to unidirectional digital pulses. These digital pulses are fed together with recovered clock pulses to a multiplier such as an exclusive OR gate, whose output is the phase error control to the VCO. This multiplier is simpler and less expensive than the above noted analog multiplier. However, a number of problems are presented with the use of the one-shot multivibrator. One-shot multivibrators are prone to variation in output pulse width due to temperature and aging. This affects the clock and data phase relationship and may cause errors in retiming the data with the recovered clock. The pulse width generally becomes a greater problem as the data rate increases, since factors affecting timing become more critical. The phase of the recovered clock in many applications requires correction in order to retime the data correctly. Furthermore, since the one-shot multivibrator produces a pulse of fixed width, the pulse width must be adjusted to the data rate at which the phase detector is to be used.

SUMMARY

The present invention provides an improved digital phase detector for NRZ data phase detection.

The phase detector is capable of high speed operation and is not sensitive to the data rate. The output clock phase is inherently correct, to eliminate corrections previously required in applications retiming the data. Furthermore, pulse durations are controlled by the local clock oscillator itself, and hence there is no need to adjust the pulse width to the data rate at which the phase detector is to be used as is the case with the above noted one-shot approach.

The NRZ data phase detector of the present invention generates a measuring interval initiated by a data transition and terminated not by the opposite data transition but rather by a clock transition. Termination of the measuring interval is thus not dependent upon the indeterminant time of occurrence of a falling data edge in an NRZ data stream. A variable duration pulse is generated with a length equal to the time betweenn a data transition and a given clock transition. A fixed duration pulse is generated with a length equal to the duration of a clock pulse. In one form, for normal operation, the width of the pulses are equal and the error output is zero. If one of the pulses has a longer duration than the other, then the difference therebetween affords a net error output indicating a non-zero phase differential.

In preferred form, a variable subinterval or pulse is initiated by a positive data transition and is terminated by the next occurring positive clock transition. A fixed subinterval or pulse is initiated by this positive clock transition and is terminated by the immediately succeeding negative clock transition. The fixed subinterval has a duration of one-half clock cycle. The above noted measuring interval is composed of the variable subinterval followed by the fixed subinterval. The measuring interval is initiated by the positive data transition initiating the variable subinterval, and the measuring interval is terminated by the negative clock transition terminating the fixed subinterval.

DETAILED DESCRIPTION

Figure 1:
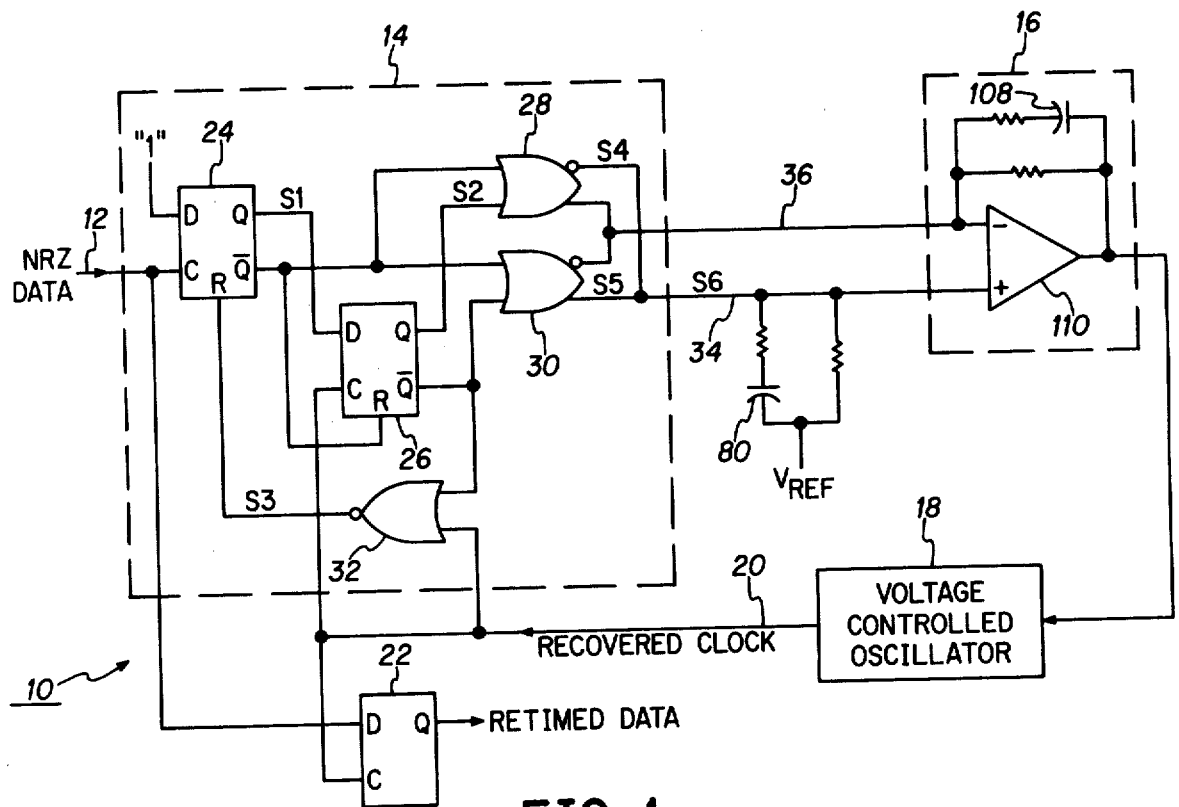
FIG. 1 is a schematic circuit diagram of a phase locked loop for clock recovery from an NRZ data stream for retiming the data, and including a digital phase detector constructed in accordance with the invention.

There is shown in FIG. 1 a phase locked loop 10 for extracting clocking information from an NRZ data stream 12, and including a digital phase detector 14 constructed in accordance with the invention. Phase detector 14 receives the NRZ data and outputs a phase error signal which is amplified by amplifier 16 and fed to a voltage controlled oscillator (VCO) 18 which generates output clock pulses having a frequency dependent upon the input control voltage. The output 20 of VCO 18 is the recovered or extracted clock which is fed back to phase detector 14 for comparison against the NRZ data. Phase detector 14 generates a phase error output signal corresponding to the difference in phase between the NRZ data 12 and the recovered clock 20. This new phase error output signal is amplified by amplifier 16 and fed to VCO 18 which adjusts the output frequency on 20 in response thereto. The recovered clock 20 and the NRZ data 12 may be fed to a retiming flip-flop 22 which outputs retimed data edge-aligned with the recovered clock.

The present invention relates to phase detector 14 shown in dashed line in FIG. 1. Phase detector 14 has phase error circuitry responsive to a data transition for initiating a measuring interval and responsive to a clock transition for terminating the measuring interval. A variable length subinterval is generated between the data transition and a given polarity clock transition, and a fixed length subinterval is generated between designated clock transitions. The duration difference between the variable subinterval and the fixed subinterval provides phase indication.

Phase detector 14 includes a first gate provided by flip-flop 24 responsive to a data transition for initiating a measuring interval. A second gate is provided by flip-flop 26 and responds to clock pulses and to the output of the first gate 24 for generating a fixed duration pulse between given clock transitions following the noted data transition. Output gate means provided by OR gates 28 and 30 respond to the outputs of the first and second gates 24 and 26 for generating a variable duration pulse between the noted data transition and a given clock transition. Reset gate means provided by NOR gate 32 responds to clock pulses and to the output of the second gate 26 for resetting the first and second gates at the clock transition terminating the fixed duration pulse.

Flip-flop 24 has a D input tied to a high or digital 1 logic state. The C (clock) input receives the NRZ data stream on line 12. The Q output of flip-flop 24 is connected to the D input of flip-flop 26. The $\overline{Q}$ output of flip-flop 24 is connected to the R (reset) input of flip-flop 26. The C input of flip-flop 26 receives the clock pulses from line 20. The $\overline{Q}$ output of flip-flop 24 and the Q output of flip-flop 26 are fed to OR gate 30. An inverted output of OR gate 28 and a true output of OR gate 30 are combined and output on line 34 to amplifier 16. The true output of OR gate 28 and an inverted output of OR gate 30 are combined and output on line 36 to amplifier 16. The $\overline{Q}$ output of flip-flop 26 and clock pulses from line 20 are fed to NOR gate 32 whose output is connected to the R input of flip-flop 24.

Figures 2, 3, 4:
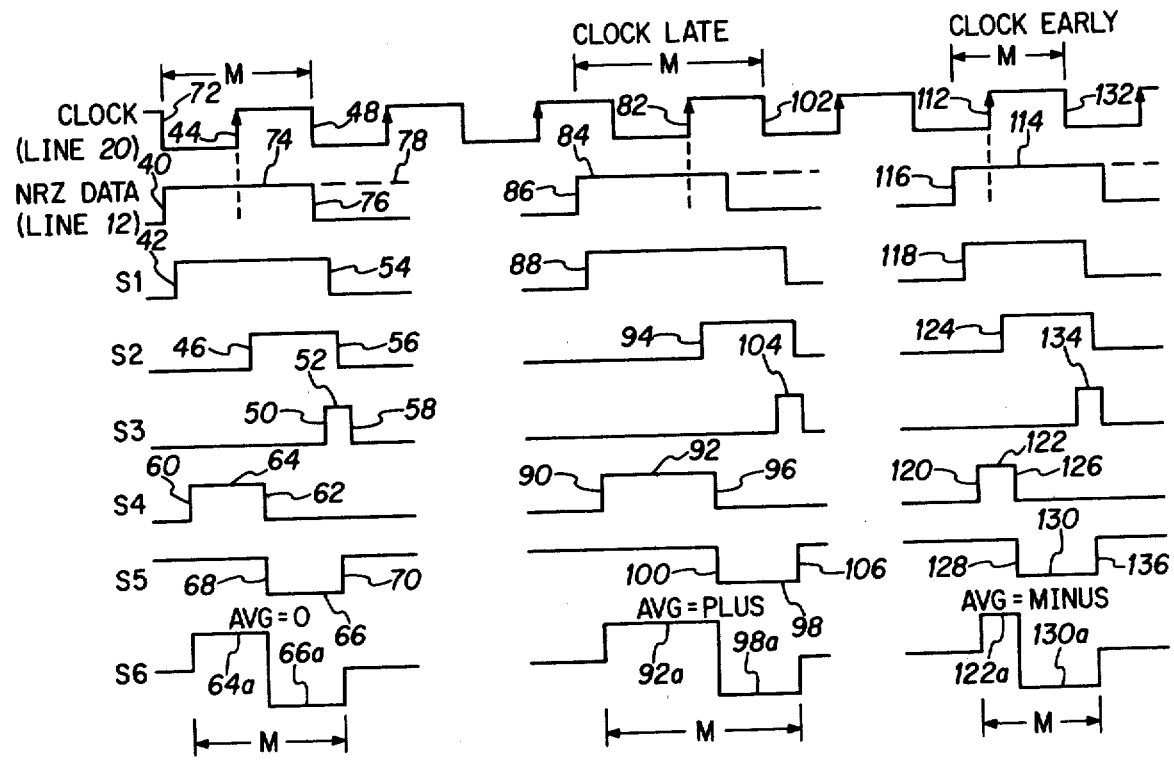
FIGS. 2 through 4 are timing diagrams illustrating operation of the circuit of FIG. 1.

Referring to FIG. 2, a positive data transition 40 on line 12 toggles flip-flop 24 such that its Q output, designated signal S1, transitions high as shown at 42. At the next positive clock transition 44 on line 20, the S1 signal is clocked through flip-flop 26 such that its Q output, signal S2, transitions high at 46. After the next clock transition 48, which is negative going, both inputs to NOR gate 32 are low. This is because the Q output S2 of flip-flop 26 is high and hence the $\overline{Q}$ output of flip-flop 26 is low, and the clock signal on line 20 has just transitioned low. Since both inputs to NOR gate 32 are now low, the output of NOR gate 32, designated signal S3, transitions high at 50 to provide a reset signal for resetting flip-flops 24 and 26. Reset pulse 52 resets flip-flop 24 such that its Q output S1 transitions low at 54. The $\overline{Q}$ output of flip-flop 24 concurrently transitions high, which resets flip-flop 26 such that its Q output S2 transitions low at 56. The $\overline{Q}$ output of flip-flop 26 concurrently transitions high, and thus the S3 output of NOR gate 32 transitions low at 58 to terminate the reset signal.

When the Q output S1 of flip-flop 24 transitions high at 42, the inverted output of OR gate 28, designated S4, also transitions high as shown at 60. This is because the $\overline{Q}$ output of flip-flop 24 transitions low when S1 transitions high and because S2 is also in a low state, whereby both inputs to OR gate 28 are low and hence its inverted output S4 goes high.

At positive going clock transition 44, signal S4 transitions low at 62 to terminate variable length pulse 64 of signal S4. This is because the Q output S2 of flip-flop 26 transitions high at 46 in response to clock transition 44, and hence the S2 input to OR gate 28 goes high which in turn causes the S4 output to go low at 62. Pulse 64 in signal S4 has a variable duration initiated at 60 by data transition 40 and terminated at 62 by clock transition 44.

Clock transition 44 also initiates a fixed length pulse 66 on the output of OR gate 30, designated S5. At clock transition 44, the $\overline{Q}$ output of flip-flop 26 transitions low because the Q output S2 of flip-flop 26 transitions high. At this time the $\overline{Q}$ output of flip-flop 24 is also in a low state, and hence both inputs to OR gate 30 are low, whereby output S5 transitions low as shown at 68. At the next clock transition, as shown at negative going edge 48, reset pulse 52 in signal S3 is generated as above described, which resets flip-flop 24, whereby the Q output S1 of flip-flop 24 goes low and the $\overline{Q}$ output of flip-flop 24 goes high which in turn drives the output S5 of OR gate 30 to transition high at 70 to terminate fixed duration pulse 66. Pulse 66 in signal S5 has a length of one clock pulse, i.e., one-half clock cycle.

Signals S4 and S5 are combined on output 34, schematically depicted as signal S6 in FIG. 2. Signal S6 has a first portion 64a corresponding to pulse 64 in signal S4 and a second portion 66a corresponding to pulse 66 in signal S5. In FIG. 2, the length or duration of positive pulse 64a is equal to the duration of negative pulse 66a. The average is thus zero, which indicates an in-phase condition between the clock and data. For the embodiment of FIG. 1, this in-phase condition occurs when a falling clock edge such as 72 aligns with a rising data edge 40. The rising clock edge 44 occurs in the middle of data pulse 74.

Measuring interval M is initiated by data edge 40 and is terminated by clock edge 48. NRZ data pulse 74 lasts one full clock cycle and may or may not be terminated at clock edge 48. If the next data bit is a 0, pulse 74 will transition low as shown at 76. If the next data bit is a 1, then the NRZ data signal will remain high as shown at 78.

Measuring interval M relies on a data transition 40 for its initiation. The termination of measuring interval M, however, does not rely on a data transition but rather upon a clock transition. With NRZ data, it is not known when falling edge 76 will occur, and hence a clock transition having a known relative time of occurrence is used for termination of measuring interval M.

As shown by signal S6 in FIG. 2, measuring interval M is composed of a variable length subinterval 64a and a fixed length subinterval 66a. The phase error circuitry generates variable length subinterval 64a between a data transition and a given polarity clock transition, and generates fixed length subinterval 66a between designated clock transitions.

The averaging of pulses 64a and 66a is effected by capacitor 80 connected in a resistance network to a voltage reference. Capacitor 80 is first charged by pulse 64 and then oppositely charged by pulse 66. The resultant net charge is zero and thus the pulse error output signal delivered to VCO 18 reflects an in-phase condition, and no compensating adjustment is made to the clock frequency output on line 20.

FIG. 3 illustrates operation of the phase error circuitry of phase detector 14 when the clock pulses on line 20 occur late with respect to the NRZ data on line 12. As seen in FIG. 3, clock transition 82 occurs later than half-way through data pulse 84.

Rising data transition 86 causes the Q output S1 of flip-flop 24 to transition high at 88 which in turn causes the S4 output of OR gate 28 to transition high at 90. This initiates measuring interval M and variable duration subinterval pulse 92. At the next positive clock transition, which is edge 82, the Q output S2 of flip-flop 26 transitions high at 94. This terminates variable length pulse 92 at edge 96 and also initiates fixed duration pulse 98 at edge 100. At the next clock transition, which is negative going edge 102, reset pulse 104 in signal S3 is activated which drives the $\overline{Q}$ output of flip-flop 24 high which in turn causes output S5 of OR gate 30 to transition high at 106 to terminate fixed length pulse 98 and measuring interval M.

In FIG. 3, variable duration subinterval 92a is longer than fixed duration subinterval 98a, and this difference in duration provides phase indication. The average of positive pulse 92 and negative pulse 98 is a positive value, and capacitor 80 is left with a net positive charge which is amplified by amplifier 16 and fed to VCO 18 which in turn changes the output clock frequency on line 20.

The amplification afforded by amplifier 16 is increased by increasing the offset difference between its plus and minus inputs. This is done by charging its minus input from line 36 in the opposite direction from its plus input on line 34. The true output of OR gate 28 is combined with the inverted output of OR gate 30 and delivered on line 36. Referring to FIG. 3, when positive pulse 92 in signal S4 is positively charging capacitor 80, the opposite polarity output from OR gate 28 on line 36 is negatively charging capacitor 108 in the feedback circuitry of differential amplifier 110. Likewise, while negative pulse 98 in signal S5 is negatively charging capacitor 80, the opposite polarity output from OR gate 30 on line 36 is positively charging capacitor 108. The net charge on capacitor 108 is thus negative which in conjunction with the net positive charge on capacitor 80 provides an increased offset between the positive and negative inputs to amplifier 110, whereby greater amplification is obtained. It is thus seen that the output gate means afforded by OR gates 28 and 30 enables increased amplification of the phase error signal output by phase detector 14. Another advantage is that the absolute voltage levels associated with logic 1 and logic 0 on the outputs of gates 28 and 30 are made unimportant, as long as the levels from both gates are the same for each logic level. This is important when implemented with ECL, for instance, since the logic levels drift significantly, but predictably, with temperature.

Referring to FIGS. 2 and 3, fixed length pulse 66 is equal to fixed length pulse 98, and each are equal to one clock pulse length, i.e., one-half clock cycle. Variable length pulse 92 is longer than variable length pulse 64, and hence the measuring interval M in FIG. 3 is longer than the measuring interval M in FIG. 2.

FIG. 4 illustrates operation of the phase error circuitry of phase detector 14 when the clock on line 20 is early with respect to the NRZ data. As shown in FIG. 4, clock transition 112 occurs earlier than half-way through NRZ data pulse 114.

At data transition 116, S1 goes high at 118 and S4 goes high at 120 to initiate measuring interval M and variable duration subinterval 122a. At the next positive going clock transition, which is edge 112, S2 transitions high at 124 and pulse 122 in signal S4 transitions low at 126 to terminate variable duration subinterval 122a. Concurrently at clock edge 112, S5 transitions low at 128 to initiate fixed duration subinterval 130a. At the next clock transition, which is negative going edge 132, reset pulse 134 is generated in signal S3 which causes S5 to transition high at 136 to terminate fixed length pulse 130 and hence to terminate fixed duration subinterval 130a and measuring interval M. Variable duration subinterval 122a is shorter than fixed duration subinterval 130a, which results in an average minus value.

Referring to FIGS. 2 through 4, measuring interval M is initiated by a rising data edge and is unaffected by a falling data edge. Measuring interval M is terminated by a clock edge having a known time of occurrence relative to another clock edge used for terminating the variable duration subinterval. The variable subinterval is initiated by the noted data transition and is terminated by a given polarity clock transition. The fixed subinterval is initiated by this last mentioned clock transition and is terminated by the immediately succeeding clock transition of opposite polarity.

Figure 5:
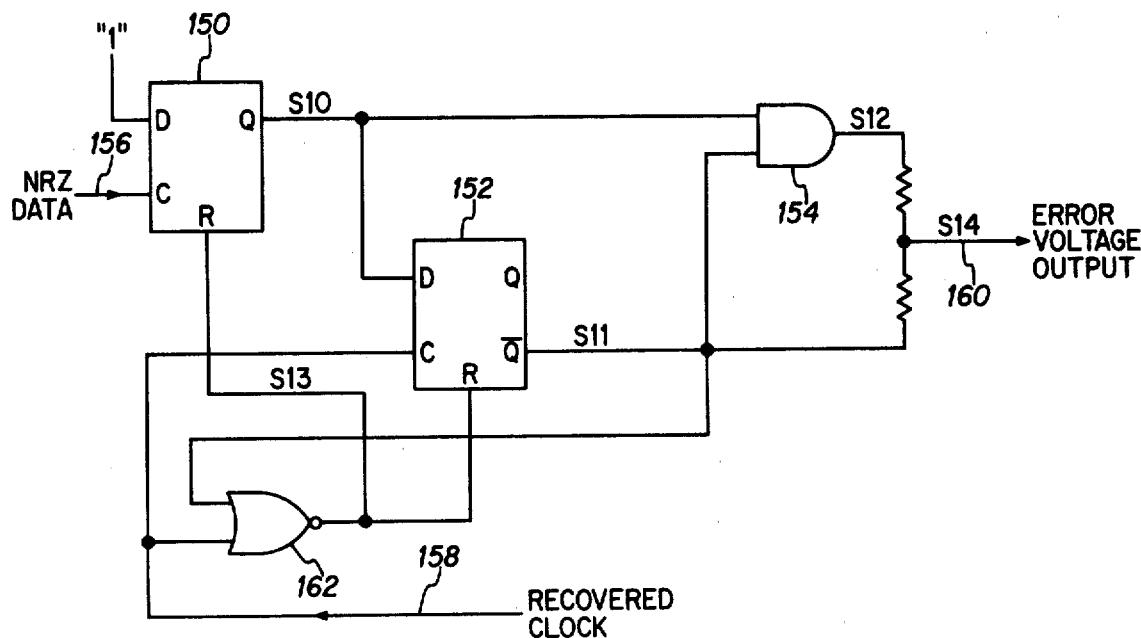
FIG. 5 is a schematic circuit diagram of an alternate embodiment of a phase detector constructed in accordance with the invention.

FIG. 5 shows an alternate embodiment of the phase error circuitry of phase detector 14 of FIG. 1. A first gate is provided by flip-flop 150 which responds to a data transition for initiating a measuring interval. A second gate is provided by flip-flop 152 and responds to clock pulses and to the output of the first gate for generating a fixed duration pulse between designated clock transitions following the data transition. Output gate means is provided by an AND gate 154 responsive to the outputs of the first and second gates for generating a variable duration pulse between the data transition and a given clock transition.

Flip-flop 150 has a D input tied to a given high or digital 1 logic state, and a C input receiving NRZ data from line 156. The Q output of flip-flop 150 is connected to one of the inputs of AND gate 154 and to the D input of flip-flop 152. The C input of flip-flop 152 receives clock pulses from line 158 generated by a VCO (not shown) as in FIG. 1. The $\overline{Q}$ output of flip-flop 152 is connected to the other input of AND gate 154. The output of AND gate 154 and the $\overline{Q}$ output of flip-flop 152 are combined and output on line 160 providing a phase error signal comparable to that on line 34 in FIG. 1. A reset gate is provided by NOR gate 162 receiving the $\overline{Q}$ output of flip-flop 152 and the clock signal from line 158. The output of NOR gate 162 is connected to the R inputs of flip-flops 150 and 152.

Figures 6, 7, 8:
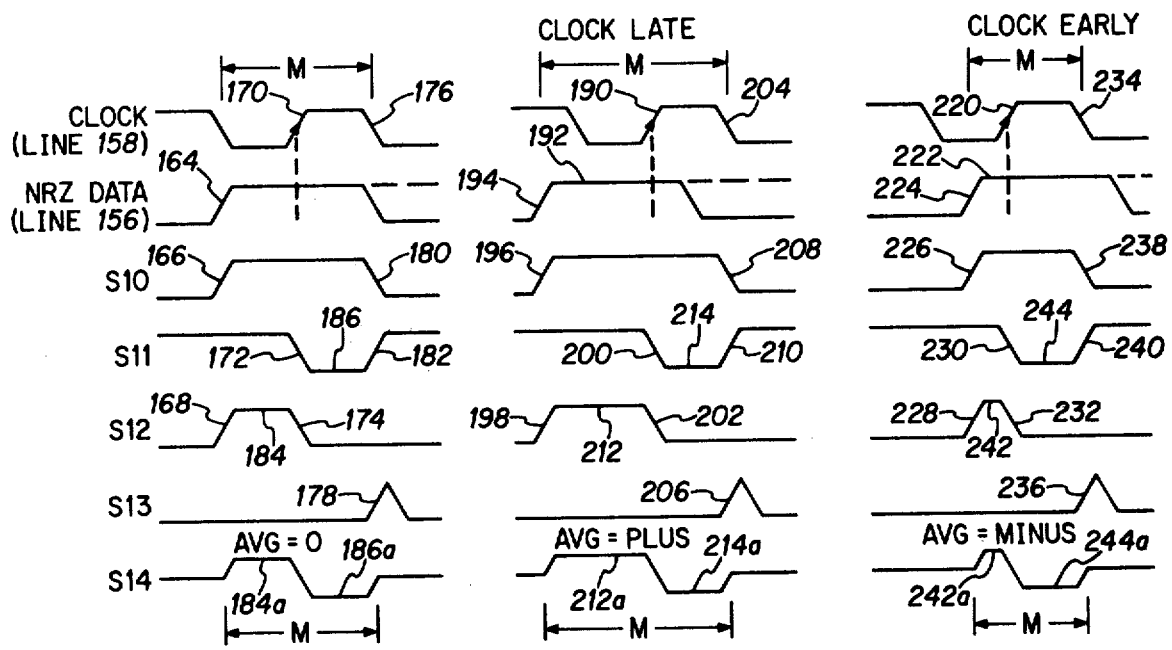
FIGS. 6 through 8 are timing diagrams illustrating operation of the circuit of FIG. 5.

FIG. 6 illustrates operation of the phase error circuitry of FIG. 5 when the clock and data are in correct phase relationship. The transition edges are shown slightly slanted as to be more realistic than the vertical transition edges in FIGS. 2 through 4, particularly with respect to the relating gate delays. Rising data transition 164 causes the Q output of flip-flop 150, designated signal S10, to transition high at 166. The $\overline{Q}$ output of flip-flop 152, designated S11, is high at this time, and hence both inputs to AND gate 154 are high, whereby the output of AND gate 154, designated S12, goes high at 168. At the next positive transition of the clock on line 158, which is edge 170, the Q output S10 of flip-flop 150 is clocked through flip-flop 152 whereby the Q output of flip-flop 152 goes high and the $\overline{Q}$ output S11 transitions low at 172. This negative transition of S11 causes the output S12 of AND gate 154 to transition low at 174. At the next clock transition, which is negative going edge 176, the output S13 of reset NOR gate 162 goes high at 178. This is because both inputs to NOR gate 162, namely the clock on line 158 and the S11 signal from the $\overline{Q}$ output of flip-flop 152, are both low and hence the output of NOR gate 162 goes high to generate reset pulse 178. Pulse 178 resets flip-flops 150 and 152 such that S10 transitions low at 180 and S11 transitions high at 182.

Signals S12 and S11 are combined on output 160 and represented by signal S14 in FIG. 6. Pulse 184 in signal S12 is a variable length pulse between data transition 164 and clock transition 170, and provides a variable duration subinterval 184a in signal S14. Negative pulse 186 in signal S11 is a fixed length pulse between clock transitions 170 and 176, and provides fixed duration subinterval 186a in signal S14. Variable subinterval 184a and fixed subinterval 186a have the same duration and hence the clock and data phase relationship is correct.

In FIG. 6, the measuring interval is initiated by data transition 164 and is terminated not be a data transition but by clock transition 176. Data transition 164 also initiates variable duration subinterval 184a. This variable subinterval 184a is terminated by clock transition 170, which clock transition also initiates fixed subinterval 186a. The measuring interval M and the fixed subinterval 186a are terminated by clock transition 176.

FIG. 7 illustrates operation of the phase error circuitry of FIG. 5 when the recovered clock pulses occur late with respect to the NRZ data. As seen in FIG. 7, positive clock transition 190 occurs later than half-way through data pulse 192. Positive data transition 194 causes S10 to transition high at 196 and S12 to transition high at 198. The next positive clock transition, which is edge 190, causes S11 to transition low at 200 and S12 to transition low at 202. The next clock transition, which is negative going edge 204, initiates reset pulse 206 on S13 which causes S10 to transition low at 208 and S11 to transition high at 210. Variable length pulses 212, which provides variable duration subinterval 212a, is longer than fixed length pulse 214, which provides fixed duration subinterval 214a. The difference in duration between these subintervals provides phase indication. Since positive pulse 212 is longer than negative pulse 214, a net or average plus signal is provided on S14 which in turn provides a phase error control voltage to the VCO to change the latter's output clock pulse frequency.

FIG. 8 shows operation of the phase error circuitry of FIG. 5 when the clock pulses occur too early with respect to the NRZ data. In FIG. 8, positive clock transition 220 occurs earlier than half-way through data pulse 222. Positive data transition 224 causes S10 to transition high at 226 and S12 to transition high at 228. The next positive clock transition, which is edge 220, causes S11 to transition low at 230 and S12 to transition low at 232. The next clock transition, which is negative going edge 234, initiates reset pulse 236 in S13 which in turn causes S10 to transition low at 238 and S11 to transition high at 240. Variable length pulse 242 in S12 is shorter than fixed length pulse 244 in S11, thus providing variable duration subinterval 242a on S14 shorter than fixed duration subinterval 244a. The average or net phase error signal on S14 is thus a minus value, which in turn adjusts the VCO output frequency such that the clock pulses will occur slightly later, and thus bring the clock and data back into correct phase relationship.

It is recognized that various modifications are possible within the scope of the appended claims.

I claim:

1. An NRZ data phase detector comprising:
   first and second flip-flops, each having a data input, a clock input, a reset input, a first output and a second output providing a logic value which is the complement of said first output,
   said first flip-flop having a fixed logical value at its data input and receiving NRZ data at its clock input, so as to set the first flip-flop at a first data transition,
   said second flip-flop receiving at its data input one of the outputs of the first flip-flop and receiving at its clock input a recovered clock signal, so that said second flip-flop becomes set on a first transition of said recovered clock signal while said first flip-flop is set,
   reset gate means having the output thereof connected to the reset input of said first flip-flop and responsive to one of the outputs of said second flip-flop and to said recovered clock for resetting said first flip-flop upon the occurrence of a second transition of said recovered clock while said second flip-flop is set, thereby generating from said first flip-flop a variable duration pulse initiated by said data transition and terminated by said second clock transition, said second flip-flop receiving at the reset input thereof one of the outputs of the first flip-flop, so as to reset the second flip-flop upon reset of the first flip-flop, thereby generating a fixed duration pulse determined by said first and second clock transitions, output gate means responsive to outputs of said first and second flip-flops for deriving phase information from said variable and fixed duration pulses.

* * * * *